United States Patent [19]

Costantino et al.

[11] Patent Number: 5,455,014
[45] Date of Patent: Oct. 3, 1995

[54] LIQUID DEPOSITION SOURCE GAS DELIVERY SYSTEM

[75] Inventors: Michael A. Costantino, San Marcos; William C. Yorke, Vista, both of Calif.

[73] Assignee: Highes Aircraft Company, Los Angeles, Calif.

[21] Appl. No.: 94,817

[22] Filed: Jul. 20, 1993

[51] Int. Cl.[6] .............................. A61L 9/00; G05D 7/00; F28D 7/00; F16K 49/00
[52] U.S. Cl. .................... 422/305; 422/110; 422/198; 422/199; 422/202; 422/244; 422/285; 422/307; 392/388; 392/394; 392/396; 392/400; 122/5; 137/334; 137/341
[58] Field of Search .................... 422/106, 110, 422/198, 199, 202, 244, 255, 285, 288, 290, 305, 307; 392/388, 394, 396, 397, 400, 319, 324; 122/5; 137/334, 341

[56] References Cited

U.S. PATENT DOCUMENTS

| | | | |
|---|---|---|---|
| 3,760,773 | 9/1973 | Christensen | 392/400 |
| 4,019,530 | 4/1977 | Chandroga | 137/334 |
| 4,220,460 | 9/1980 | Partus | 65/3 A |
| 5,000,113 | 3/1991 | Wang et al. | 118/723 |
| 5,040,046 | 8/1991 | Chhabra et al. | 357/54 |
| 5,240,024 | 8/1993 | Moore et al. | 137/38 |
| 5,252,134 | 10/1993 | Stauffer | 118/726 |
| 5,272,880 | 12/1993 | Nishizato et al. | 62/50.7 |

*Primary Examiner*—Robert J. Warden
*Assistant Examiner*—Christopher Y. Kim
*Attorney, Agent, or Firm*—W. C. Schubert; W. K. Denson-Low

[57] ABSTRACT

A liquid deposition source delivery system (22) includes a reactant source (50) of a liquid chemical reactant, a first heater (54) positioned adjacent to the reactant source (50), and a vapor collection system (56) in communication with the reactant source (50) to collect vapor evolved from the reactant source (50). A flow controller (64) has an upstream side (66) in communication with the vapor collection system (56). A line (70) of a vapor distribution system is in communication with the downstream side (68) of the flow controller (64). A second heater (76) is positioned adjacent to the flow controller (64), at least a portion of the vapor collection system (56), and at least a portion of the vapor distribution system, to prevent the vapor from condensing in the lines (70) of the delivery system. One purge system (94) is used for the upstream side of the flow controller (64) and the vapor collection system (56), and a second purge system (96) is used for the downstream side of the flow controller (64) and the lines (70) of the vapor distribution system.

17 Claims, 2 Drawing Sheets

LIQUID DEPOSITION SOURCE GAS DELIVERY SYSTEM

BACKGROUND OF THE INVENTION

This invention relates to the deposition of thin layers from reactive gases, and, more particularly, to a system for delivering such gases to a deposition reactor.

In chemical vapor deposition (CVD), one or more reactive gases is contacted to a substrate that has been energized, as by heating. With the proper selection of the reactive gas or gases, the substrate type and temperature, gas partial and total pressures, and other operating parameters, the reactive gases deposit a selected material as a gradually thickening layer onto the surface of the substrate. The deposition continues until the desired thickness is reached.

The reactive gases used in the reactive deposition are provided from either gaseous or liquid sources. Liquid sources have become increasingly popular, as the reactive gases are often safer to handle and less toxic when provided in their liquid forms. Prior to the reactive deposition, the liquid source is heated to produce a vapor of the reactive gas, which is conducted to the substrate and reacted.

Several heretofore unsolved problems have been encountered in delivery systems that utilize liquid sources of the reactive gases. Flow variations in individual gases are sometimes observed, leading to variations in composition of the deposited layer. Deposits can build up in the interior of the delivery system. Contaminants can enter the system during operating transitions such as the changing of sources. Although acceptable deposited structures can often be made in spite of these problems, it would be preferred to improve deposition and delivery system operation through their solution.

There is therefore a need for an improved reactive gas delivery system for use with liquid sources. The present invention fulfills this need, and further provides related inventions.

SUMMARY OF THE INVENTION

The present invention provides a gas delivery system operating from at least one liquid source, for use in reactive gas deposition procedures such as chemical vapor deposition. The gas delivery system minimizes the introduction of contamination during changeovers and at other times. Flow variations are also largely avoided by preventing the deposition of unreacted vapor in the gas delivery system. The absence of contamination and the avoidance of the deposition of unreacted vapor prevents the buildup of contamination deposits within the gas delivery system. The gas delivery system of the invention is compatible with the use of high-precision controllers such as mass flow controllers, permitting careful control of the composition of the deposited layers.

In accordance with the invention, a liquid deposition source delivery system comprises means for supplying a flow of a vapor having a boiling point greater than ambient temperature and means for controlling the flow of the vapor. The means for controlling has an upstream side in communication with the means for supplying and a downstream side. The apparatus also includes means for distributing a flow of the vapor, which is in communication with the downstream side of the means for controlling the flow of the vapor. There is a means for heating at least a portion of the means for supplying, the means for controlling the flow of the vapor, and at least a portion of the means for distributing.

In another embodiment, a liquid deposition source delivery system comprises a reactant source of a liquid chemical reactant, and a first heater positioned adjacent to the reactant source. A vapor collection system is in communication with the reactant source to collect vapor evolved from the reactant source. A flow controller has an upstream side in communication with the vapor collection system and a downstream side. The apparatus includes a vapor distribution system in communication with the downstream side of the flow controller. A second heater is positioned adjacent to the flow controller, at least a portion of the vapor collection system, and at least a portion of the vapor distribution system.

The second heater, also called the means for heating, prevents reactive gas previously vaporized from the reactant source from depositing in the flow controller, the vapor collection system, and the vapor distribution system. These components are heated to a temperature above the boiling point of the reactive gas flowing in that portion of the system. The reactive gas therefore cannot deposit prior to reaching a reactor.

To minimize contamination, there is preferably provided a two-part purge system. The purge system includes a first gas purge system in communication with the vapor collection system and the upstream side of the flow controller and/or a second gas purge system in communication with the vapor distribution system and the downstream side of the flow controller. In the preferred approach, both the first and second purge systems are provided, to prevent contaminants from entering the gas delivery system during transient conditions such as source changeovers, and to clean contaminants from the delivery system if they do reach it.

The present invention provides an advance in the art of gas delivery systems, particularly those for use in reactive deposition procedures such as chemical vapor deposition. Other features and advantages of the present invention will be apparent from the following more detailed description of the preferred embodiment, taken in conjunction with the accompanying drawings, which illustrate, by way of example, the principles of the invention.

DETAILED DESCRIPTION OF THE INVENTION

Figure 1:
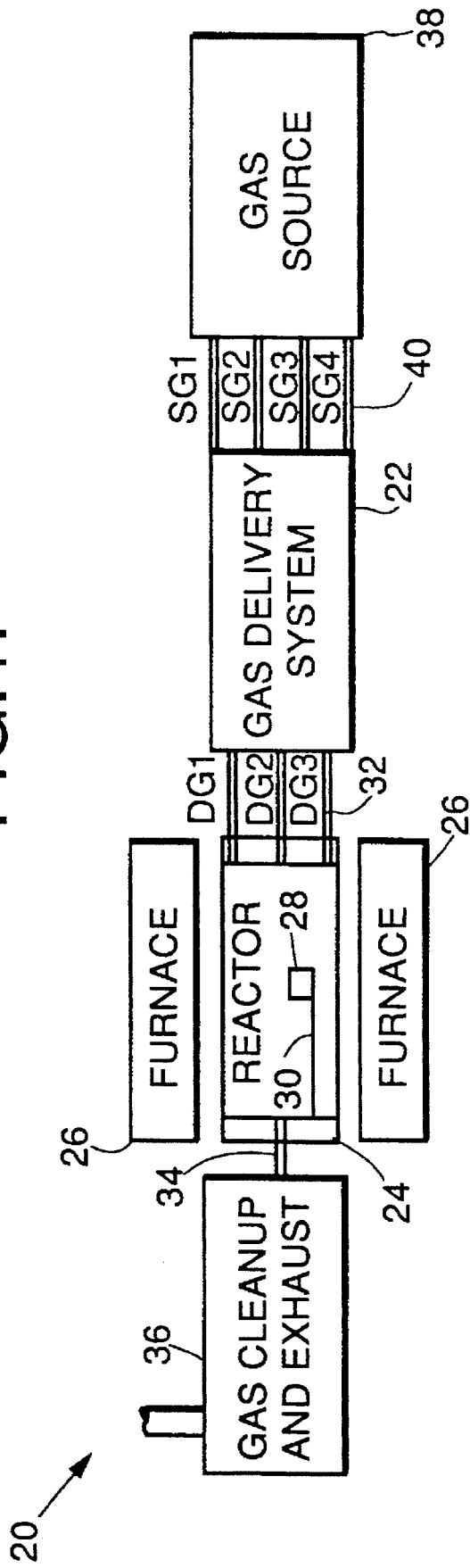
FIG. 1 is a schematic diagram of a reactive gas deposition system.
Figure 2:
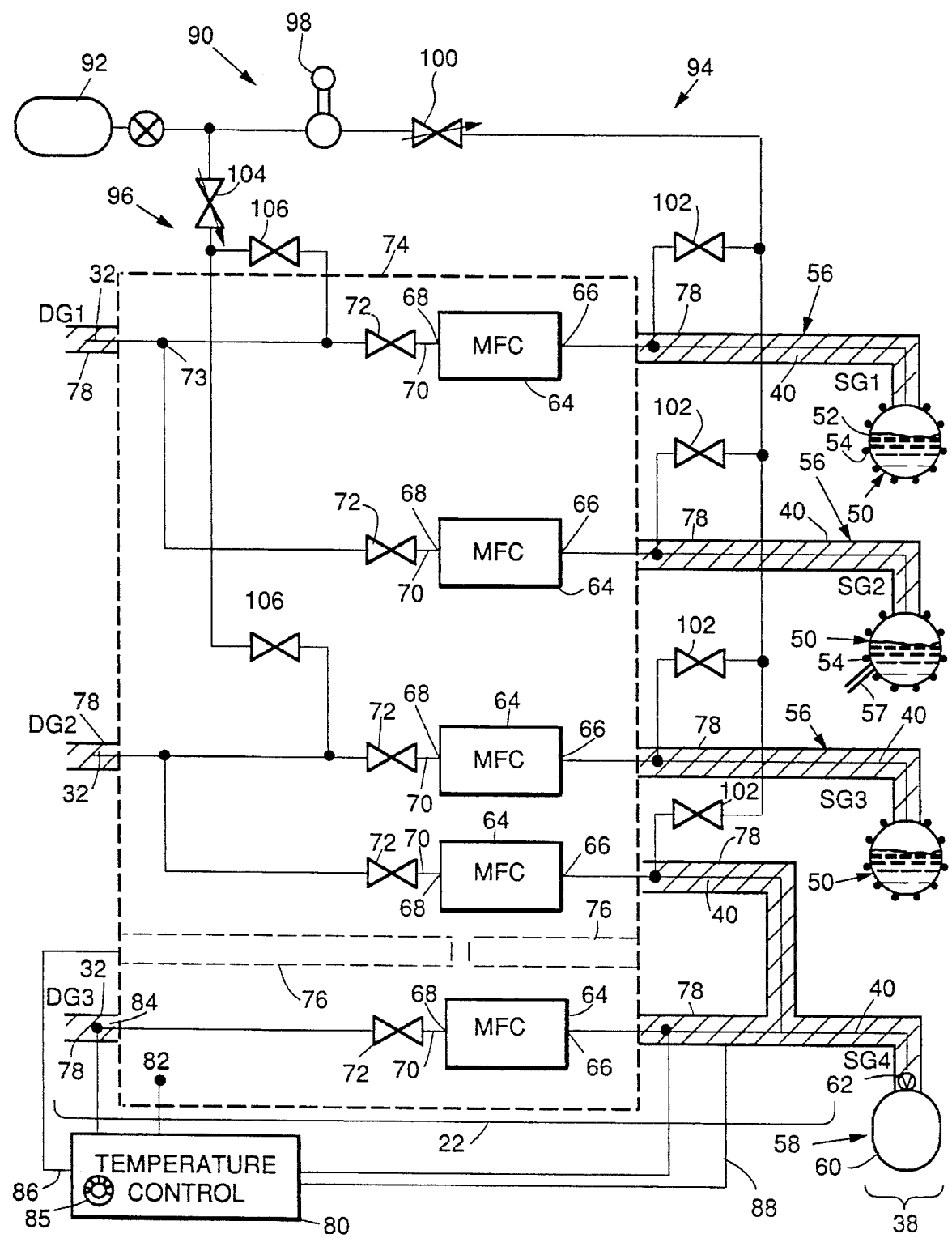
FIG. 2 is a more detailed schematic diagram of the gas delivery portion of the deposition system of FIG. 1.

FIG. 1 illustrates a reactive gas deposition system 20 in which the present invention is used. FIG. 2 illustrates a portion of the deposition system 20, the gas delivery system 22 of the invention, in more detail. These systems 20 and 22 are illustrated with various combinations of gas flow sources and deliveries utilized in a preferred embodiment. The present invention is not limited to these particular combinations.

The reactive gas deposition system 20 includes a reactor 24, typically in the form of a quartz tube, that is heated by a furnace 26 around the reactor 24. A substrate 28, upon which the reactive gas deposition product is to be deposited, is supported within the reactor by a fixture 30.

Reactive gases and other gases are provided to the reactor 24 through one or more delivery gas lines 32. The delivery gas lines 32 extend from the gas delivery system 22 to the reactor 24. The reactive gas or gases enter the heated reactor 24, mix together within the reactor 24, and deposit the desired solid layer onto the surface of the substrate 28. In the preferred embodiment, there are three delivery gas lines 32, labelled DG1, DG2, and DG3 for subsequent reference.

The unreacted portion of the reactive gases and any gaseous reaction products leave the reactor 24 through an exit line 34 and enter a gas cleanup and exhaust system 36. In the gas cleanup and exhaust system 36, particulate matter in the gas is removed and any unreacted gases are reacted so that there is diminished tendency for downstream deposition of solids. After the completion of the gas cleanup, the gas is exhausted.

Gases are delivered to the gas delivery system from a gas source 38 through source gas lines 40.

The present invention is concerned with the gas delivery system 22 and to some extent its relation with the delivery gas lines 32, the source gas lines 40, and the gas source 38. The relevant structures are discussed in greater detail in relation to FIG. 2. The details of the construction of the reactor 24, the furnace 26, and the gas cleanup and exhaust system 36 are known in the art for conventional systems, and do not form a part of the present invention. They are presented here only to show the context of the use of the present invention.

FIG. 2 presents the schematic flow diagram for a preferred form of the gas delivery system 22. In the system of FIG. 2, several different types of gases are provided and combined in different ways, to illustrate some possibilities of the system. In each case, reactive gases flow from a source, of which there are liquid and gaseous types. In a liquid source 50, a container 52 of the liquid is maintained at a preselected vaporization temperature by a heating system 54. The heating system 54 preferably includes a combination of heating and cooling coils and a thermostat. Such heating systems 54 are available commercially, the presently preferred heating system 54 being the Schumaker heating system model STC 115.

A vapor collection system 56 captures the gaseous vapor evolved from the liquid source 50. In some types of liquid sources, the reactive gas vapors alone are captured and conducted to the reactor. In other types of liquid sources, an inert carrier gas such as argon is bubbled through the container 52, and the vapor is mixed with the carrier gas to be carried to the reactor. This latter type of liquid source is not preferred in the present invention, but is illustrated in one of the liquid sources of FIG. 2 with a carrier gas line 57 to show the general applicability of the present invention. Three separate liquid sources 50 are shown in FIG. 2. A gaseous source 58 preferably includes a pressurized gas bottle 60 and a regulator 62. Gas flowing from the gaseous source 58 is conducted in the vapor collection system 56.

The vapor collection system 55 includes the source gas lines 40 extending from the liquid source 50 or gaseous source 58 to a mass flow controller ("MFC") 64. In the illustrated case, there are four sources 50 and 58, and therefore four source gas lines 40, SG1, SG2, SG3, and SG4. The MFC 64 is an available commercial unit which accurately and controllably establishes the mass flow of each gas type to the reactor 24. The Unit Instruments Model 1200 and Vacuum General Model LC2 are preferred. The source gas lines 40 enter an upstream side 66 of the MFC 64 and exit a downstream side 68. In some instances, as shown here for the case of the gaseous source 58, a single source can supply gas to more than one mass flow controller.

From the downstream side 68 of the MFC 64, the gas flows through gas delivery system internal lines 70 to a shutoff valve 72 that can isolate each respective gas source 38 and MFC 64 from the remainder of the gas delivery system 22 and reactor 24. The shutoff valves 72 are of particular use when sources or controllers are to be changed.

In some cases, the reactive gas from the source flows directly to the reactor 24 and is mixed with the other reactive gases in the reactor. In other cases, it is preferred to mix combinations of reactive gases prior to their entering the reactor, and then to mix these combination mixes in the reactor. In the present illustration, two pairs of the reactive gases are mixed within the gas delivery system 22, at mixing locations 73 where there is a confluence of flows in two lines 70. This particular illustrated arrangement results in three delivery gas lines 32 extending from the gas delivery system 22 to the reactor 24, lines DG1, DG2, and DG3. Other requirements for gas delivery will result in other mixing combinations and delivery gas line arrangements.

To prevent recondensation of the vaporized gases from the sources 50 before they reach the reactor 24, heating means is provided to heat at least a portion of the system that supplies the gas to the reactor after it leaves the gas sources. In the illustrated embodiment, there are two types of heaters in the heating means. To aid in heating the components of the gas delivery system 22 such as the MFCs 64, the valves 72, the lines 70, and other apparatus, these components are mounted on a support base 74. The preferred support base 74 is a thermally conductive block of metal, such as an aluminum alloy. For the gas delivery system 22 shown in FIG. 2, the support base 74 was an aluminum alloy block about 24×24×1.5 inches in size, but the size will vary according to the number of components to be mounted thereon.

The support base 74 is heated by appropriate heaters 76 contacting the support base 74, which by conduction heats the components mounted thereon. In the preferred approach, the heaters are cartridge heaters such as the Model CIR made by Omega. In FIG. 2, only two of the heaters 76 are shown for clarity of illustration.

The other type of heater for the gas delivery system and its related lines is a heater for the lines 32 and 40. This heater is preferably a heating tape 78 that is wrapped around the lines 32 and 40. Heating tape is a commercially available product, and a preferred heating tape is the model QTVB available from Raythem. The heating tape 78 is wrapped around the lines containing condensable vapors produced in the sources 50, and optionally around the lines that conduct gas from the gaseous source 58.

The heaters 76 and 78 are controlled by a temperature controller 80, to maintain the delivery system 22 and the lines 32 and 40 at a temperature sufficiently high that the vapors flowing to the reactor 24 do not condense. The controller 80 receives a temperature feedback signal from temperature sensors 82 in the block and temperature sensors 84 on the lines 32 and 40. The controller 80 compares the measured temperatures with that set by a set point input 85 on the controller 80, and supplies heat through the heaters 76 and 78 accordingly. The power lines 86 and 88, respectively, for the heaters 76 and 78 operate from power supplies in the temperature controller 80. (Only a few of the temperature sensors and power lines are shown in FIG. 2 for the sake of clarity in illustration.)

A gas delivery purge system 90 prevents unwanted contaminants from reaching the reactor 24. The gas delivery purge system 90 includes a purge gas source 92 of a purge gas such as nitrogen. The purge gas source 92 supplies purge gas to a first gas purge system 94 and a second gas purge system 96.

The first gas purge system 94 is in communication with the vapor collection system 56 and the upstream side 66 of the mass flow controller 64. It includes a low pressure regulator 98 that controllably reduces the pressure in the system 94 to a very low value for use in calibration work, and a flow meter 100 that serves as a flow controller. Purge gas from the system 94 controllably flows to the individual vapor collection systems 56 and mass flow controllers 64 through valves 102. As illustrated, the purge gas system 94 may be used on only some of the source lines, and not on others. It is preferably used in conjunction with all liquid sources 50 but optionally in conjunction with gas sources 58.

The first gas purge system 94 performs three important functions. The first is to purge contaminants from the vapor collection system 56 and the upstream side 66 of the mass flow controller 64 when the source 50 is changed. When a source 50 is to be changed, the valve 72 is closed and the valve 102 opened so that purge gas continually flows through the affected portions of the system. Most of the flow of potential contaminants into the gas delivery system 22 and thence to the reactor 24 is thereby prevented. The second function is to continue to purge contaminants from the affected portions of the system after the valve 72 is reopened. This continuing purge function is also used at other times, if there is reason to believe that any deposits of condensed vapors or contaminants have developed within the gas source lines 40 or the MFCs 64.

The third function of the gas purge system 94 is in the calibration of the mass flow controllers. When a mass flow controller 64 is to be calibrated, the purge gas system 94 is operated with the valves 72 and 102 open. The actual flow of the purge gas is established by adjusting the regulator 98 and measured by the flow meter 100, which is specifically calibrated for the particular purge gas. The reading of the mass flow controller 64 is measured for various values of the flow through the flow meter 100. The mass flow controller 64 is calibrated to the flow rates of the specific reactive gas vapor using these values and standard calibration tables for the mass flow controller.

In conventional practice, when a mass flow controller is to be calibrated, it is removed from the gas system and taken to a separate calibration station. After calibration is complete, the MFC is replaced in the system. This procedure is slow, particularly where there are multiple MFCs, and introduces contaminants into the gas system each time the lines are opened. As a result, calibration is commonly deferred as much as possible, possibly leading to inaccuracies in the mass flows reaching the reactor 24. With the present approach, calibration is less onerous, and can be accomplished readily and at any time other than when deposition operations are actually underway.

The second gas purge system 96 includes a flow meter 104 that controls and measures the flow of the purge gas. Access of the purge gas to the various gas systems is controlled by valves 106. The second gas purge system 96 communicates with the vapor distribution distribution system in the form of the delivery gas lines 32 and the downstream side 68 of the mass flow controller 64 through the valves 72 when open. The second gas purge system 96 permits the downstream portion of the gas delivery system to be separately purged from the upstream portion. Separate purging is desirable because the first gas purge system 94 can deliver only a relatively slow purging flow through the MFC 64.

The reactive gas deposition system 20 of FIG. 1 with the gas delivery system 22 of FIG. 2 has been built and operated. It is highly effective in depositing high purity layers onto substrates from gas and liquid sources. Contamination is reduced and efficiency of operation is increased, as compared with conventional systems.

Other features and advantages of the present invention will be apparent from the following more detailed description of the preferred embodiment, taken in conjunction with the accompanying drawings, which illustrate, by way of example, the principles of the invention.

What is claimed is:

1. A liquid deposition source delivery system, comprising:

a reactant source of a liquid chemical reactant;

a first heater positioned adjacent to the reactant source;

a vapor collection system in communication with the reactant source to collect vapor evolved from the reactant source;

a flow controller having an upstream side in communication with the vapor collection system and a downstream side;

a vapor distribution system in communication with the downstream side of the flow controller; and a second heater positioned adjacent to the flow controller, the vapor collection system, and the vapor distribution system, the second heater being operable to heat an entire vapor flow path from the reactant source to a remote termination of the vapor distribution system.

2. The delivery system of claim 1, further including a first gas purge system in communication with the vapor collection system and the upstream side of the flow controller.

3. The delivery system of claim 2, wherein the first gas purge system comprises:

a purge gas source having a purge gas source outlet, a pressure regulator having a pressure regulator inlet in communication with the purge gas source outlet, and having a pressure regulator source outlet, and a first purge flow controller having a first purge flow controller inlet in communication with the pressure regulator outlet, and a first purge flow controller outlet in communication with the vapor collection system and the upstream side of the flow controller.

4. The delivery system of claim 1, further including a second gas purge system in communication with the vapor distribution system and the downstream side of the flow controller, the communication being direct and not through the flow controller.

5. The delivery system of claim 4, wherein the second gas purge system comprises:

a purge gas source having a purge gas source outlet, and a second purge flow controller having a second purge flow controller inlet in communication with the purge gas source outlet, and a second purge flow controller outlet in communication with the vapor distribution system and the downstream side of the flow controller.

6. The delivery system of claim 1, further including an additional reactant source of an additional liquid chemical reactant;

an additional first heater positioned adjacent to the additional reactant source;

an additional vapor collection system in communication with the additional reactant source to collect vapor evolved from the additional reactant source;

an additional flow controller having an upstream side in communication with the additional vapor collection system and a downstream side; and an additional vapor distribution system in communication with the downstream side of the additional flow controller;

and wherein the second heater is positioned adjacent to the additional flow controller, at least a portion of the additional vapor collection system, and at least a portion of the additional vapor distribution system.

7. The delivery system of claim 1, wherein the flow controller includes a mass flow controller.

8. The delivery system of claim 1, wherein the second heater includes a first heating tape wrapped onto the vapor collection system, a second heating tape wrapped onto the vapor delivery system, and a conductive heater adjacent to the flow controller.

9. A liquid deposition source delivery system, comprising:

means for supplying a flow of a vapor having a boiling point greater than ambient temperature;

means for controlling the flow of the vapor, the means for controlling having an upstream side in communication with the means for supplying and a downstream side;

means for distributing a flow of the vapor, the means for distributing being in communication with the downstream side of the means for controlling the flow of the vapor; and second purging means for purging at least a portion of the means for distributing and at least a portion of the means for controlling the flow of the vapor, the second purging means being connected to the means for distributing such that a purge gas can flow from the second purging means to the means for distributing without passing through the means for controlling.

10. The delivery system of claim 9, further including first purging means for purging at least a portion of the means for supplying and at least a portion of the means for controlling the flow of the vapor.

11. The delivery system of claim 10, wherein the first purging means comprises:

means for supplying a purge gas, the means for supplying having a purge gas source outlet, means for regulating the pressure of the purge gas received from the means for supplying, and means for controlling the flow of the purge gas received from the means for supplying.

12. The delivery system of claim 9, wherein the second purging means comprises:

means for supplying a purge gas, the means for supplying having a purge gas source outlet, and means for controlling the flow of the purge gas received from the means for supplying.

13. The delivery system of claim 9, further including:

means for heating at least a portion of the means for supplying, the means for controlling the flow of the vapor, and at least a portion of the means for distributing.

14. A liquid deposition source delivery system, comprising:

a reactant source of a liquid chemical reactant;

a first heater positioned adjacent to the reactant source;

a vapor collection system in communication with the reactant source to collect vapor evolved from the reactant source;

a flow controller having an upstream side in communication with the vapor collection system and a downstream side;

a vapor distribution system in communication with the downstream side of the flow controller;

a second heater positioned adjacent to the flow controller, at least a portion of the vapor collection system, and at least a portion of the vapor distribution system;

a first gas purge system in communication with the vapor collection system and the upstream side of the flow controller; and a second gas purge system in communication with the vapor distribution system and the downstream side of the flow controller.

15. The delivery system of claim 14, wherein the first gas purge system comprises:

a purge gas surface having a purge gas source outlet, a pressure regulator having a pressure regulator inlet in communication with the purge gas source outlet, and having a pressure regulator source outlet, and a first purge flow controller having a first purge flow controller inlet in communication with the pressure regulator outlet, and a first purge flow controller outlet in communication with the vapor collection system and the upstream side of the flow controller.

16. The delivery system of claim 14, wherein the second gas purge system comprises:

a purge gas source having a purge gas source outlet, and a second purge flow controller having a second purge flow controller inlet in communication with the purge gas source outlet, and a second purge flow controller outlet in communication with the vapor distribution system and the downstream side of the flow controller.

17. The delivery system of claim 14, further including an additional reactant source of an additional liquid chemical reactant;

an additional first heater positioned adjacent to the additional reactant source;

an additional vapor collection system in communication with the additional reactant source to collect vapor evolved from the additional reactant source;

an additional flow controller having an upstream side in communication with the additional vapor collection system and a downstream side; and an additional vapor distribution system in communication with the downstream side of the additional flow controller;

and wherein the second heater is positioned adjacent to the additional flow controller, at least a portion of the additional vapor collection system, and at least a portion of the additional vapor distribution system.

* * * * *